United States Patent
Vernenker et al.

(10) Patent No.: US 7,221,607 B1
(45) Date of Patent: May 22, 2007

(54) MULTI-PORT MEMORY SYSTEMS AND METHODS FOR BIT LINE COUPLING

(75) Inventors: Hemanshu T. Vernenker, Austin, TX (US); Louis De La Cruz, Pflugerville, TX (US); Allen White, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 75 days.

(21) Appl. No.: 11/054,011

(22) Filed: Feb. 9, 2005

(51) Int. Cl.
  *G11C 7/02* (2006.01)
(52) U.S. Cl. ............... 365/210; 365/189.04; 365/194; 365/230.05
(58) Field of Classification Search ......... 365/189.01, 365/189.04 X, 191, 194 X, 207, 210, 230.05 X
  See application file for complete search history.

(56) References Cited

U.S. PATENT DOCUMENTS

| | | | |
|---|---|---|---|
| 5,317,537 A | * | 5/1994 | Shinagawa et al. .... 365/189.04 |
| 5,596,539 A | * | 1/1997 | Passow et al. ............... 365/210 |
| 6,144,608 A | | 11/2000 | Artieri |
| 6,181,626 B1 | | 1/2001 | Brown |
| 6,201,757 B1 | * | 3/2001 | Ward et al. ............. 365/230.05 |
| 6,285,604 B1 | | 9/2001 | Chang |
| 6,804,153 B2 | * | 10/2004 | Yoshizawa et al. .... 365/189.07 |

\* cited by examiner

*Primary Examiner*—VanThu Nguyen
(74) *Attorney, Agent, or Firm*—MacPherson Kwok Chen & Heid LLP; Greg J. Michelson

(57) ABSTRACT

Systems and methods provide bit line coupling detection techniques for multi-port memory applications. For example, in accordance with an embodiment of the present invention, a memory includes at least one column of memory having a plurality of memory cells and at least two ports and a dummy column having a dummy memory cell and a first port and a second port. At least one bit line is provided for each port of the columns of memory and the dummy column, with the dummy column adapted to provide a read timing indication by performing a write operation through the first port at substantially the same time as a read operation through the second port.

20 Claims, 3 Drawing Sheets

MULTI-PORT MEMORY SYSTEMS AND METHODS FOR BIT LINE COUPLING

TECHNICAL FIELD

The present invention relates generally to electrical circuits and, more particularly, to memory, including for example multi-port memory and techniques to account for bit line coupling.

BACKGROUND

Memory is widely used in a wide variety of applications. A typical memory has an array of memory cells arranged in rows and columns, with the memory cells read to or written from by utilizing word lines and bit lines. The bit lines generally link the memory cells within corresponding columns.

One drawback with respect to the bit lines is the potential for coupling to occur between the bit lines of different ports in a multi-port memory. For example, a write operation performed on one port may slow down the read operation on another port. This problem becomes more severe as geometries shrink and the coupling capacitance between wires increases. As a result, there is a need to provide techniques to address bit line coupling.

SUMMARY

In accordance with one embodiment of the present invention, a memory includes at least one column of memory having a plurality of memory cells and at least two ports; a dummy column having a dummy memory cell and a first port and a second port; and a bit line for each port of the at least one column of memory and the dummy column, wherein the dummy column is adapted to provide a read timing indication by performing a write operation through the first port at substantially the same time as a read operation through the second port.

In accordance with another embodiment of the present invention, an integrated circuit includes a plurality of columns of memory having a plurality of memory cells and a plurality of ports; a plurality of bit lines associated with the plurality of ports; and a dummy column adapted to provide a read completion signal based on a substantially simultaneous read and write operation for the dummy column.

In accordance with another embodiment of the present invention, a method to account for bit line coupling in a multi-port memory includes performing a read operation in a first column of the multi-port memory; performing a write operation in the first column of the multi-port memory at substantially the same time as the read operation; and providing a read completion signal to the other columns of the multi-port memory indicating the read operation is complete in the first column.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Systems and methods are disclosed herein, in accordance with one or more embodiment of the present invention, to address bit line coupling in multi-port memory devices. For example, in accordance with an embodiment of the present invention, a dummy column is incorporated into a multi-port memory to model bit line coupling in the multi-port memory.

For example, in a typical dummy column scheme in a single port memory, a differential sense amplifier in the dummy column detects when a read operation is completed, with a "DONE" flag being asserted. The "DONE" flag being asserted indicates that a worst-case read operation has been completed and that it is now safe to latch in data from the sense amplifiers in the other columns, shut off the word lines, and begin precharging the bit lines. This ensures that the correct data is latched in for all of the bits in the array and also conserves power by shutting off the word line and precharging the bit lines as soon as it is safe to perform these operations.

However, in multi-port memories, this type of scheme does not represent the worst-case timing, because it does not model the coupling between the bit lines of different ports. Thus, in accordance with an embodiment of the present invention, a dummy column scheme is disclosed that accounts for the coupling between the bit lines. For example, the dummy column scheme performs a read operation from one port (e.g., Port B) on the farthest bit in the dummy column every time a read operation is performed from any bit in the memory array. In addition, a write operation is performed simultaneously in the dummy column on the other port (e.g., Port A), such that a worst-case bit line coupling may be accounted for during the read operation of the bit in the dummy column.

Thus, in accordance with an embodiment of the present invention, the dummy column with coupling detection may take into account a worst-case bit line coupling situation between the different ports of a multi-port memory (i.e., a read performed through one port while a write is performed through another port in the dummy column). Consequently, when a read operation is performed on the memory, the dummy column mimics a read operation through one of the ports and a write operation through the other port of the dummy column. A signal (e.g., a "DONE" signal) may then be asserted indicating that the worst-case read operation has been completed and that it is safe to latch in the data from the sense amplifiers, shut off the word lines, and begin precharging the bit lines.

Figure 1:
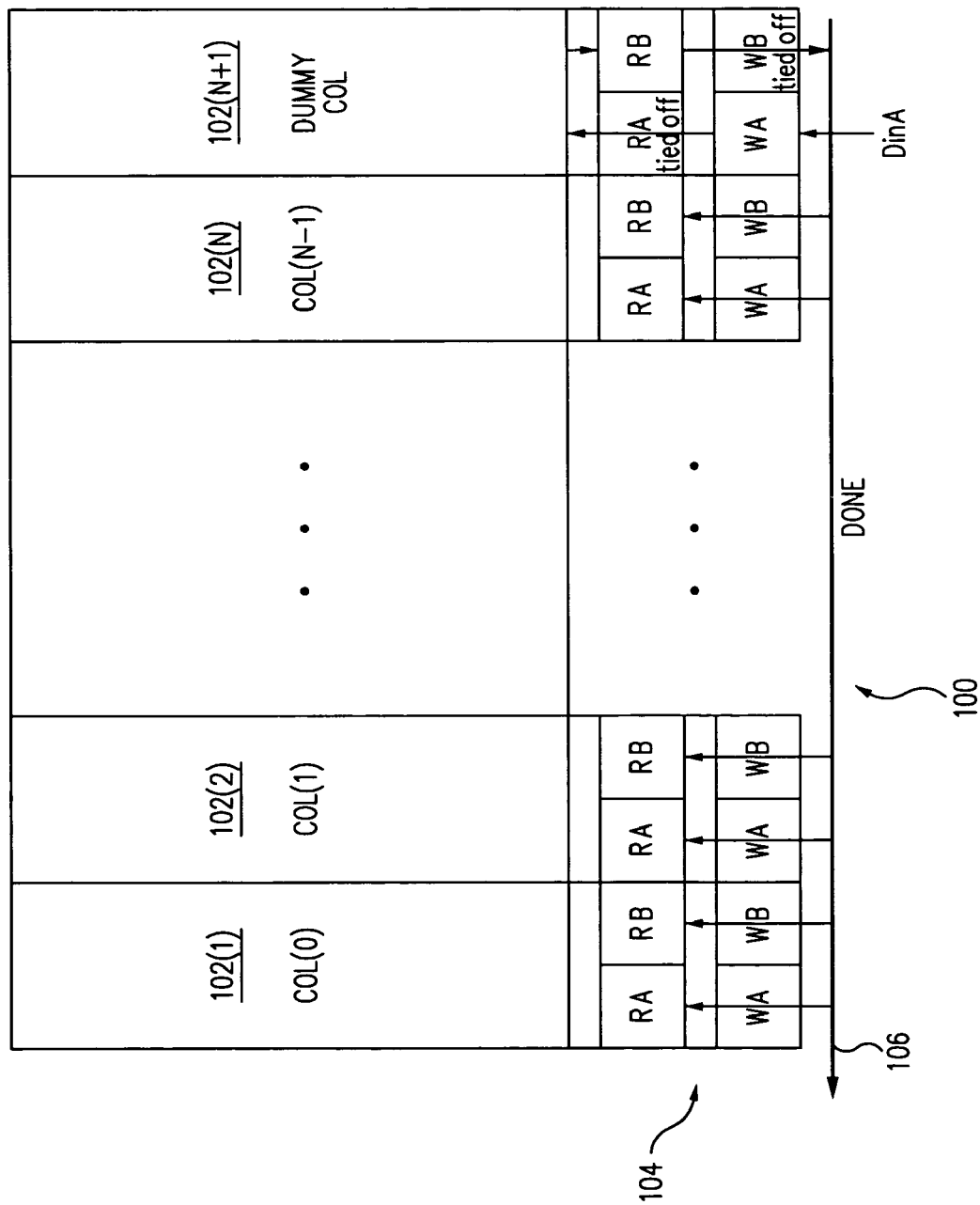
FIG. 1 shows a block diagram illustrating a memory in accordance with an embodiment of the present invention.

As an example, FIG. 1 shows a block diagram illustrating a memory 100 in accordance with an embodiment of the present invention. Memory 100 includes columns 102 and read/write ports 104. Columns 102 represent the memory array of memory cells (e.g., arranged in rows and columns), with columns 102 separately referenced as columns 102(1) through 102(N+1) (i.e., "N+1" columns, where "N" represents any desired number).

For this exemplary implementation, memory 100 is illustrated as a dual port memory core. However, the techniques discussed herein may be applied to any type of multi-port memory (i.e., a memory having two or more ports), including for example pseudo dual port memories and registers (e.g., register files). One or more of memory 100 may also be incorporated into an integrated circuit (e.g., a programmable logic device, such as a complex programmable logic device or a field programmable gate array, or an application specific integrated circuit).

Read/write ports 104 represent the read and write column circuitry for Ports A and B (labeled RA and RB and WA and WB, with "R" representing a read function and "W" representing a write function for the specified port). Read/write ports 104 are illustrated generally and do not include specific detail, dependent upon the desired application, such as column multiplexer circuitry to allow a group of columns to share column circuitry (e.g., sense amplifiers and write drivers).

Column 102(N+1) represents a dummy column, which may be arranged as the farthest column from the row driver circuits (not shown). Column 102(N+1) may be employed to model a worst-case bit line coupling scenario between different ports in memory 100. For example, in this exemplary implementation, column 102(N+1) models a bit line coupling scenario of a read performed through one of its ports (e.g., Port A) while a write is performed through one of its other ports (e.g., Port B).

Thus, for example, when a read operation is performed from a location in columns 102(1), 102(2), . . . , or 102(N), a read operation is also performed from a bit (memory cell) in the same row in column 102(N+1). Furthermore, to ensure that any delays due to bit line coupling is taken into account in the timing, write control signals for the other port in column 102(N+1) are also asserted (i.e., fired). When the read operation in column 102(N+1) is completed, a signal 106 (e.g., a "DONE" flag) may be sent that indicates completion of the worst case read operation (as would be understood by one skilled in the art).

Figure 2:
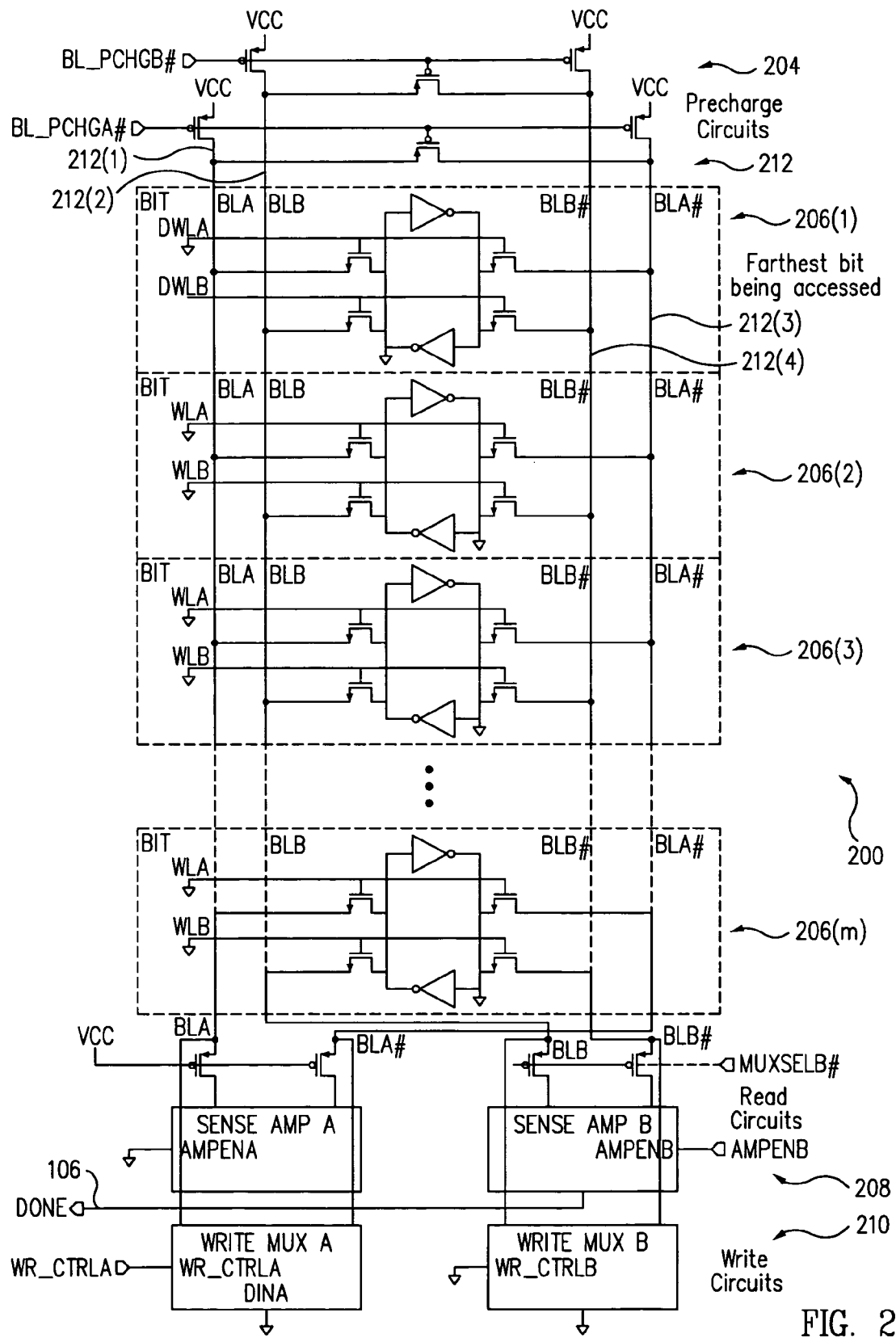
FIG. 2 shows a block diagram illustrating a portion of the memory of FIG. 1 in accordance with an embodiment of the present invention.

As a specific implementation, FIG. 2 shows a circuit 200, which is an exemplary circuit implementation of column 102(N+1) of FIG. 1 in accordance with an embodiment of the present invention. As noted above, memory 100 is illustrated as a dual port memory, but it should be understood that the techniques discussed herein (e.g., for circuit 200) may be applied to any type of multi-port memory having two or more ports. Circuit 200 includes precharge circuits 204, memory cells (bit cells) 206, read circuits 208, write circuits 210, and bit lines 212 (which are separately referenced as bit lines 212(1) through 212(4), with bit lines 212(1) and 212(3) complementary Port A bit lines and bit lines 212(2) and 212(4) complementary Port B bit lines).

Memory cells 206, which are separately referenced as memory cells 206(1) through 206(m) (where "m" represents any desired number), represent the bit cells for the dummy column. Precharge circuits 204, read circuits 208, write circuits 210, and bit lines 212 represent generally the read, write, and associated circuitry for a column of memory as would be known by one skilled in the art.

Memory cell 206(1) may be physically located as the farthest bit in the memory array (e.g., of memory 100), with memory cell 206(1) being the bit location in the dummy column that is farthest from the column circuitry (e.g., read circuits 208 and write circuits 210). The data stored in memory cell 206(1) may be forced low, for example, while the data stored in memory cells 206(2) through 206(m) in circuit 200 may be forced high (e.g., as shown in FIG. 2 by how the memory cells are tied to ground). Furthermore, the wordlines (labeled WLA and WLB) for memory cells 206(2) through 206(m) are also tied low (e.g., to ground), as shown. This helps to ensure that the worst-case leakage is also accounted for with memory cells 206(2) through 206(m) in the dummy column leaking in the opposite direction as memory cell 206(1) (i.e., the farthest dummy bit).

In this exemplary implementation, Port B is used as the read port while Port A is used as a dummy write port that performs a pseudo write at approximately the same time as the read operation. The pseudo write operation, for example, is not a full write operation, because memory cell 206(1) has its Port A wordline, labeled DWLA, tied low (e.g., to ground as shown). Consequently, no data is actually written into memory cell 206(1).

However, a transition (e.g., rail to rail) does occur for bit lines 212 of Port A (labeled BLA and BLA#) and, therefore, a signal through bit lines 212 of Port A does couple into bit lines 212 of Port B (labeled BLB and BLB#) in a similar fashion as would occur during a normal or true write operation. If a normal (i.e., full) or true write operation was desired, the write operation may be directed to another memory cell (i.e., to one of memory cells 206(2) through 206(m)) in the dummy column, which in turn would require the assertion of another dummy wordline. However, because the objective (e.g., to model coupling between the bitlines of two ports) of the dummy column is met with the pseudo write, there may be no added benefit to performing a normal write operation.

As shown in FIG. 2 for the exemplary dummy column circuit implementation, read circuits 208 of Port A may be tied off (e.g., enable signal (AMPENA) tied to ground for sense amplifier A), because Port A is used only as a write port. Write control signals for Port A (e.g., labeled WR_CTRLA for write multiplexer A of write circuits 210 for Port A) may be generated in a similar manner as the write control signals to the other columns in memory 100.

Similarly, write circuits 210 of Port B may be tied off (e.g., write control signal labeled WR_CTRLB tied to ground for write multiplexer B of write circuits 210 for Port B), because Port B of circuit 200 is used only as a read port. In general, read control signals (e.g., labeled MUXSELB# and AMPENB) for circuit 200 (i.e., the dummy column) may be generated in a similar manner as the read control signals to the other columns in memory 100. As discussed in reference to FIG. 1 and shown in FIG. 2, signal 106 (e.g., a "DONE" flag) may be asserted to indicate completion of the worst case read operation.

Figure 3:
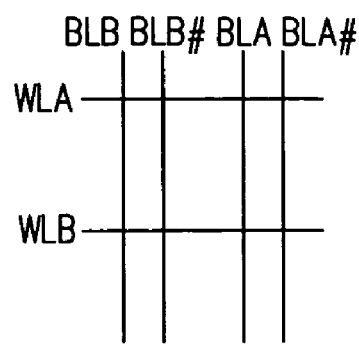
FIG. 3 illustrates an exemplary physical layout of bit lines and wordlines in accordance with an embodiment of the present invention.

FIG. 3 illustrates an exemplary physical layout (e.g., in the metal layers) of bit lines and word lines in accordance with an embodiment of the present invention. The complementary bit lines for Ports A and B are labeled BLA, BLA# and BLB, BLB#, respectively, while the word lines for Ports A and B are labeled WLA and WLB, respectively.

As illustrated in FIG. 3, the bit line BLA is adjacent to the bit line BLB#. Consequently, the worst-case bit line coupling for simultaneous read and write operations may be a read of a logical low (i.e., a "0") from Port B while performing a write of a logical low through Port A (or alternatively a read and a write of a logical high (i.e., a "1")).

Figure 4:
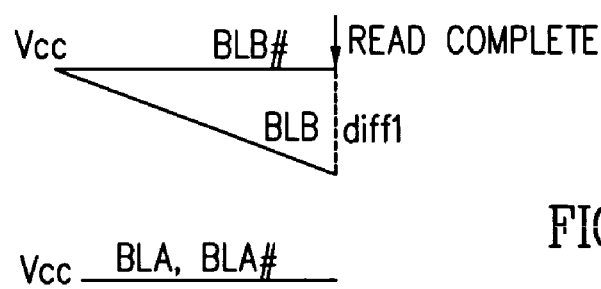
FIG. 4 illustrates exemplary bit line waveforms in accordance with an embodiment of the present invention.

FIG. 4 illustrates exemplary bit line waveforms in accordance with an embodiment of the present invention. These bit line waveforms illustrate an example of no bit line coupling between the bit lines (e.g., the bit lines BLA and BLB#). For this example, a read operation (of a logical low) is performed through Port B, while Port A remains inactive (i.e., no operation performed through Port A). To simplify the illustration, no degradation in separation is shown due to leakage in the bit cells (e.g., leakage in memory cells 206 of circuit 200).

Applied to circuit 200 having the data in the dummy bit tied low (i.e., memory cell 206(1) is set to store a zero bit), bit line 212(4) (labeled BLB#) remains at a supply voltage (labeled Vcc, assuming no leakage) when a read operation is performed. Bit line 212(2) (labeled BLB) is pulled lower by memory cell 206(1) (i.e., the bit cell) being read. The separation required between bit lines 212(2) and 212(4) for the sense amplifier to detect the read is labeled as diff1, as shown in FIG. 4 for this example.

Figure 5:
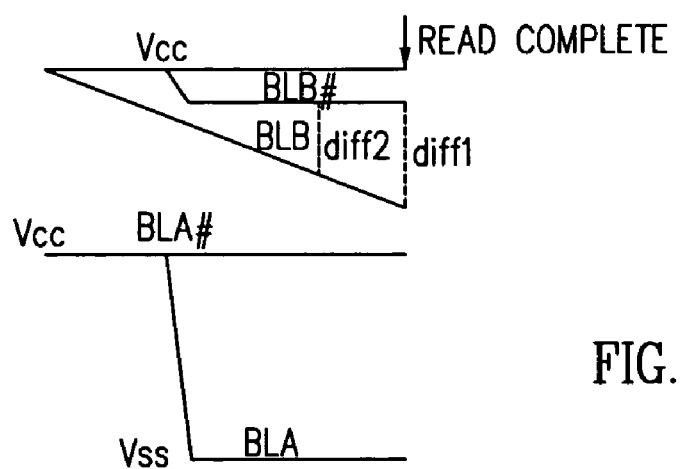
FIG. 5 illustrates exemplary bit line waveforms in accordance with an embodiment of the present invention.

FIG. 5 illustrates the exemplary bit line waveforms of FIG. 4, in accordance with an embodiment of the present invention, for a worst-case coupling during simultaneous read and write operations. For this example, a read operation is performed through Port B, while a write operation is performed through Port A.

As applied to circuit 200, Bit line 212(4) (BLB#) remains at the supply voltage level (Vcc, assuming no leakage) while bit line 212(2) (BLB) is pulled lower by memory cell 206(1) when a read operation is performed, because the data in memory cell 206(1) is tied low. However, for this example of FIG. 5, a pseudo write of a logical low (i.e., a "0") is also being performed through Port A. As a result, bit line 212(1) (BLA) is forced from the supply voltage (Vcc) towards a logical low voltage level (labeled Vss or ground).

A high to low transition on bit line 212(1) (BLA) couples into bit line 212(4) (BLB#), which forces its voltage level to drop by some amount, as shown. The reduced voltage separation between bit lines 212(2) and 212(4) (i.e., BLB and BLB#) due to this coupling is indicated as diff2 in FIG. 5 (where diff2 is less than diff1 due to the bit line coupling). Consequently, it takes longer for the sense amplifier to detect the read when there is bit line coupling between the ports. When the read operation from the dummy column (i.e., circuit 200) is completed, it is guaranteed by design that the read operation from any other bit in the memory array (e.g., memory 100) is completed. Thus, it is safe to latch in the data from the other sense amplifiers, shut off the word lines, and start precharging the bit lines.

Systems and methods are disclosed herein to provide bit line coupling detection techniques for multi-port memory applications. For example, in accordance with an embodiment of the present invention, a self-timed dummy column scheme for a multi-port memory is disclosed. The dummy column models the bit line coupling between different ports and accounts for the delay (or push out) in the read time in a multi-port memory.

Embodiments described above illustrate but do not limit the invention. It should also be understood that numerous modifications and variations are possible in accordance with the principles of the present invention. Accordingly, the scope of the invention is defined only by the following claims.

We claim:

1. A memory comprising:
    at least one column of memory having a plurality of memory cells and at least two ports;
    a dummy column having a dummy memory cell and a first port and a second port; and
    a bit line for each port of the at least one column of memory and the dummy column, wherein the dummy column is adapted to provide a read timing indication by performing a write operation through the first port at substantially the same time as a read operation through the second port.

2. The memory of claim 1, wherein the read timing indication comprises an assertion of a first signal indicating a worst-case read operation with bit line coupling has been completed.

3. The memory of claim 1, wherein the write operation is a pseudo write operation adapted to transition voltage levels of the bit lines employed for the write operation in the dummy column.

4. The memory of claim 1, wherein the read timing indication signifies that at least one of a latching of data, a switching off of word lines, and a precharging of the bit lines can occur in the at least one column of memory.

5. The memory of claim 1, wherein the dummy memory cell in the dummy column is disposed in a row farthest from column circuits, and the dummy column is disposed as the farthest column from row driver circuits.

6. The memory of claim 1, wherein the dummy column further comprises a plurality of memory cells, with the dummy memory cell set to a first state and the plurality of memory cells in the dummy column set to a second state different than the first state.

7. The memory of claim 1, wherein the memory is formed as part of a programmable logic device.

8. An integrated circuit comprising:
    a plurality of columns of memory having a plurality of memory cells and a plurality of ports;
    a plurality of bit lines associated with the plurality of ports; and
    a dummy column adapted to provide a read completion signal based on a substantially simultaneous read and write operation for the dummy column.

9. The integrated circuit of claim 8, wherein the write operation in the dummy column is a pseudo write operation adapted to transition voltage levels of the bit lines employed for the write operation in the dummy column.

10. The integrated circuit of claim 8, wherein the read completion signal signifies that at least one a latching of data, a switching off of word lines, and a precharging of the bit lines can occur in the plurality of columns of memory.

11. The integrated circuit of claim 8, wherein the dummy column further comprises a plurality of memory cells, with the dummy memory cell set to a first state and the plurality of memory cells in the dummy column set to a second state different than the first state.

12. The integrated circuit of claim 8, wherein the dummy column further comprises a dummy memory cell disposed in a row farthest from column circuits, and the dummy column is disposed as the farthest column from row driver circuits.

13. The integrated circuit of claim 8, wherein the read completion signal indicates that a read operation with bit line coupling has been completed.

14. The integrated circuit of claim 8, wherein the integrated circuit is a programmable logic device.

15. A method to account for bit line coupling in a multi-port memory, the method comprising:
- performing a read operation in a first column of the multi-port memory;
- performing a write operation in the first column of the multi-port memory at substantially the same time as the read operation; and
- providing a read completion signal to the other columns of the multi-port memory indicating the read operation is complete in the first column.

16. The method of claim 15, wherein the read completion signal indicates a worst-case read operation with bit line coupling has been completed.

17. The method of claim 15, wherein the write operation is a pseudo write operation adapted to transition voltage levels of bit lines employed for the write operation in the first column.

18. The method of claim 15, further comprising:
- latching data in the other columns of the multi-port memory;
- switching of word lines in the multi-port memory; and
- precharging bit lines after the read completion signal is received by the other columns of the multi-port memory.

19. The method of claim 15, wherein the first column comprises a dummy column.

20. The method of claim 19, wherein the dummy column comprises a plurality of dummy memory cells each having a first port and a second port and corresponding bit lines.

* * * * *